United States Patent
Chang et al.

(10) Patent No.: US 8,354,947 B2
(45) Date of Patent: Jan. 15, 2013

(54) SIGNAL PROCESSING APPARATUS WITH SIGMA-DELTA MODULATING BLOCK COLLABORATING WITH NOTCH FILTERING BLOCK AND RELATED SIGNAL PROCESSING METHOD THEREOF

(75) Inventors: Hsiang-Hui Chang, Miaoli County (TW); Caiyi Wang, Austin, TX (US); George Chien, Saratoga, CA (US); Hsin-Hung Chen, Hsinchu County (TW); Chih-Jung Chen, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 142 days.

(21) Appl. No.: 13/025,171

(22) Filed: Feb. 11, 2011

(65) Prior Publication Data
US 2012/0056767 A1   Mar. 8, 2012

Related U.S. Application Data

(60) Provisional application No. 61/380,918, filed on Sep. 8, 2010.

(51) Int. Cl.
*H03M 3/00* (2006.01)

(52) U.S. Cl. ........................ 341/143; 341/144

(58) Field of Classification Search .................. 341/143
See application file for complete search history.

(56) References Cited

U.S. PATENT DOCUMENTS

| | | | |
|---|---|---|---|
| 6,861,968 B2 * | 3/2005 | Melanson et al. | 341/143 |
| 8,149,896 B2 * | 4/2012 | Filipovic | 375/147 |
| 2007/0153878 A1 * | 7/2007 | Filipovic | 375/147 |

* cited by examiner

*Primary Examiner* — Khai M Nguyen
(74) *Attorney, Agent, or Firm* — Winston Hsu; Scott Margo

(57) ABSTRACT

One signal processing apparatus includes a sigma-delta modulating block and a notch filtering block. The sigma-delta modulating block is arranged to perform a sigma-delta modulation upon a signal input and accordingly generate a signal output. The notch filtering block is arranged to perform a notch filtering operation upon the signal output for generating a filtered signal output. Another signal processing apparatus includes a sigma-delta modulating block and a notch filtering block. The sigma-delta modulating block is arranged to perform a sigma-delta modulation upon a signal input and accordingly generate a signal output. The notch filtering block is enabled for performing a notch filtering operation upon the signal output when the signal processing apparatus operates in a first operational mode, and the notch filtering block is disabled when the signal processing apparatus operates in a second operational mode.

27 Claims, 6 Drawing Sheets

SIGNAL PROCESSING APPARATUS WITH SIGMA-DELTA MODULATING BLOCK COLLABORATING WITH NOTCH FILTERING BLOCK AND RELATED SIGNAL PROCESSING METHOD THEREOF

CROSS REFERENCE TO RELATED APPLICATIONS

This application claims the benefit of U.S. provisional application No. 61/380,918, filed on Sep. 8, 2010 and incorporated herein by reference.

BACKGROUND

The disclosed embodiments of the present invention relate to noise filtering, and more particularly, to a signal processing apparatus having a sigma-delta modulating block collaborating with a notch filtering block and related signal processing method thereof.

Any unwanted signal component would be regarded as noise, which may limit the system ability to processing weak wanted signal components. In general, the noise sources may include random noise (e.g., flicker noise, thermal noise, etc.), mixer noise, undesired cross-coupling noise, power supply noise, etc. Thus, to avoid the degradation of the wanted signal components, noise suppression technique is employed. However, the additional circuit components for achieving good noise suppression, such as active filters implemented in the analog domain, generally consume a large chip area and a large current. Thus, there is a need for an innovative design which can relax the chip area and current consumption requirements.

SUMMARY

In accordance with exemplary embodiments of the present invention, a signal processing apparatus having a sigma-delta modulating block collaborating with a notch filtering block and related signal processing method thereof are proposed to solve the above-mentioned problem.

According to a first aspect of the present invention, an exemplary signal processing apparatus is disclosed. The exemplary signal processing apparatus includes a sigma-delta modulating block and a notch filtering block. The sigma-delta modulating block is arranged to perform a sigma-delta modulation upon a signal input and accordingly generate a signal output. The notch filtering block is arranged to perform a notch filtering operation upon the signal output for generating a filtered signal output.

According to a second aspect of the present invention, an exemplary signal processing method is disclosed. The exemplary signal processing method includes: performing a sigma-delta modulation upon a signal input and accordingly generating a signal output; and performing a notch filtering operation upon the signal output and accordingly generating a filtered signal output.

According to a third aspect of the present invention, an exemplary signal processing apparatus is disclosed. The exemplary signal processing apparatus includes a sigma-delta modulating block and a notch filtering block. The sigma-delta modulating block is arranged to perform a sigma-delta modulation upon a signal input and accordingly generate a signal output. The notch filtering block is enabled for performing a notch filtering operation upon the signal output when the signal processing apparatus operates in a first operational mode, and the notch filtering block is disabled when the signal processing apparatus operates in a second operational mode.

According to a fourth aspect of the present invention, an exemplary signal processing method is disclosed. The exemplary signal processing method includes: performing a sigma-delta modulation upon a signal input and accordingly generate a signal output; when a first operational mode is active, enabling a notch filtering operation for processing the signal output; and when a second operational mode is active, stopping the notch filtering operation from processing the signal output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
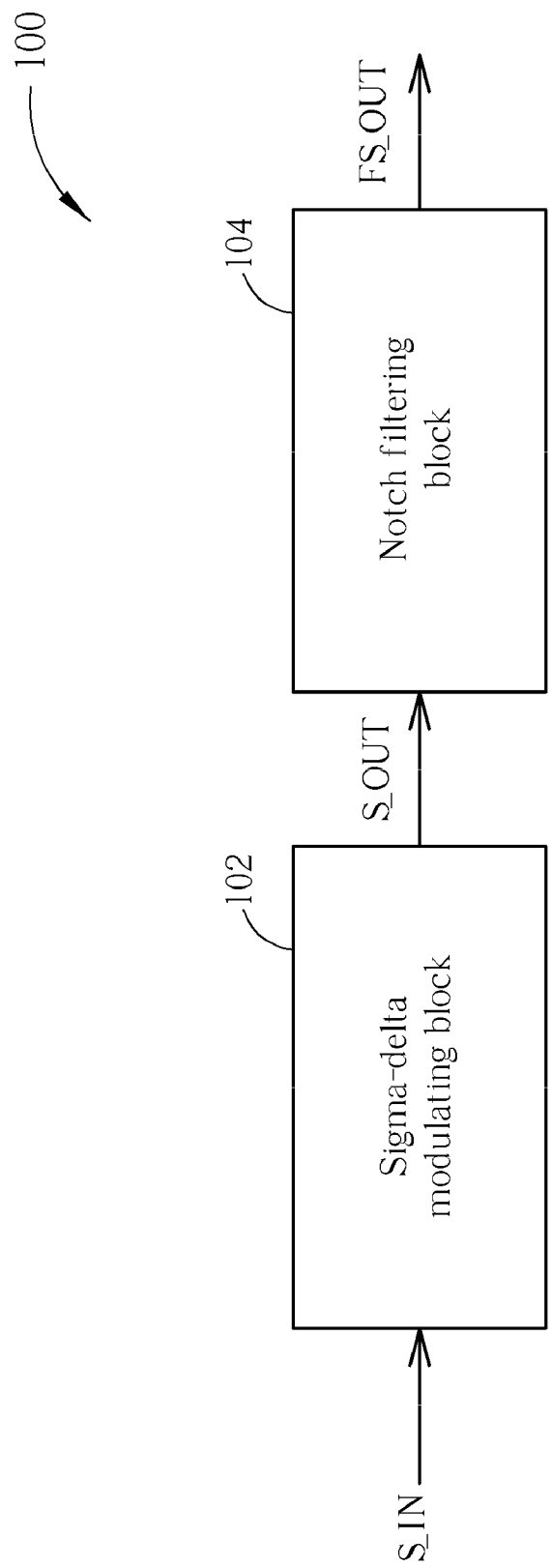
FIG. 1 is a diagram illustrating a signal processing apparatus according to a first exemplary embodiment of the present invention.

Please refer to FIG. 1, which is a diagram illustrating a signal processing apparatus according to a first exemplary embodiment of the present invention. The exemplary signal processing apparatus 100 includes, but is not limited to, a sigma-delta modulating block 102 and a notch filtering block 104. The sigma-delta modulating block 102 is arranged to perform a sigma-delta modulation upon a signal input S_IN and accordingly generate a signal output S_OUT. The notch filtering block 104 is coupled to the sigma-delta modulation block 102, and arranged to perform a notch filtering operation upon the signal output S_OUT and accordingly generate a filtered signal output FS_OUT. The combination of the sigma-delta modulating block 102 and the notch filtering block 104 is capable of attenuating an unwanted signal component at a frequency close to a desired frequency of a wanted signal component.

The sigma-delta modulation with notch filtering may be simply realized. Please refer to FIG. 2, which is a diagram illustrating an exemplary model of the signal processing apparatus 100 in a Z-transform domain. The signal input S_IN is represented by X(Z), and the filtered signal output FS_OUT is represented by Y(Z). Specifically, the output of the quantizer Q undergoes notch filtering and then acts as the filtered signal output Y(Z). The sigma-delta modulation in combination with the notch filtering operation have a signal transfer function (STF) and a noise transfer function (NTF) as follows.

$$STF=1 \quad (1)$$

$$NTF=1+H(Z)=(1-Z^{-1})^k(1+Z^{-n})^m \quad (2)$$

In above equations (1) and (2), k represents an order of the sigma-delta modulation, n is a value which controls the spacing between notch frequencies, and m represents a number of stopbands provided by the notch filtering operation. For example, in a case where the sigma-delta modulating block 102 employs a third-order sigma-delta modulation, the parameter k is equal to 3. Regarding the notch filtering, it is a filtering operation which passes all frequencies except those in at least one stopband centered at a center frequency. In a case where the notch filtering block 104 applies two notches to its input, the parameter m is equal to 2. As can be seen from equation (2), $(1-Z^{-1})^k$ is dominated by the sigma-delta modulation, and $(1+Z^{-n})^m$ is dominated by the notch filtering operation. Regarding a wanted notch frequency f (i.e., a center frequency of a particular stopband of the notch filtering), it can be estimated according to following equations.

$$1+Z^{-n}=0 \quad (3)$$

$$Z^{-n}=-1 \quad (4)$$

$$\cos 2\pi\left(\frac{nf}{F_S}\right)+j\sin 2\pi\left(\frac{nf}{F_S}\right)=-1 \quad (5)$$

Therefore, a center frequency f of an $i^{th}$ stopband and a sampling clock frequency Fs (e.g., a clock frequency of a quantizer/comparator used in sigma-delta modulation) satisfy the following equation.

$$f=\frac{2i+1}{2n}Fs, i=0, 1, 2, \ldots \quad (6)$$

It should be noted that the parameters k, m, and n should be properly designed to meet the requirement of a particular application employing the signal processing apparatus 100 shown in FIG. 1. Further description will be detailed later.

Figure 2:
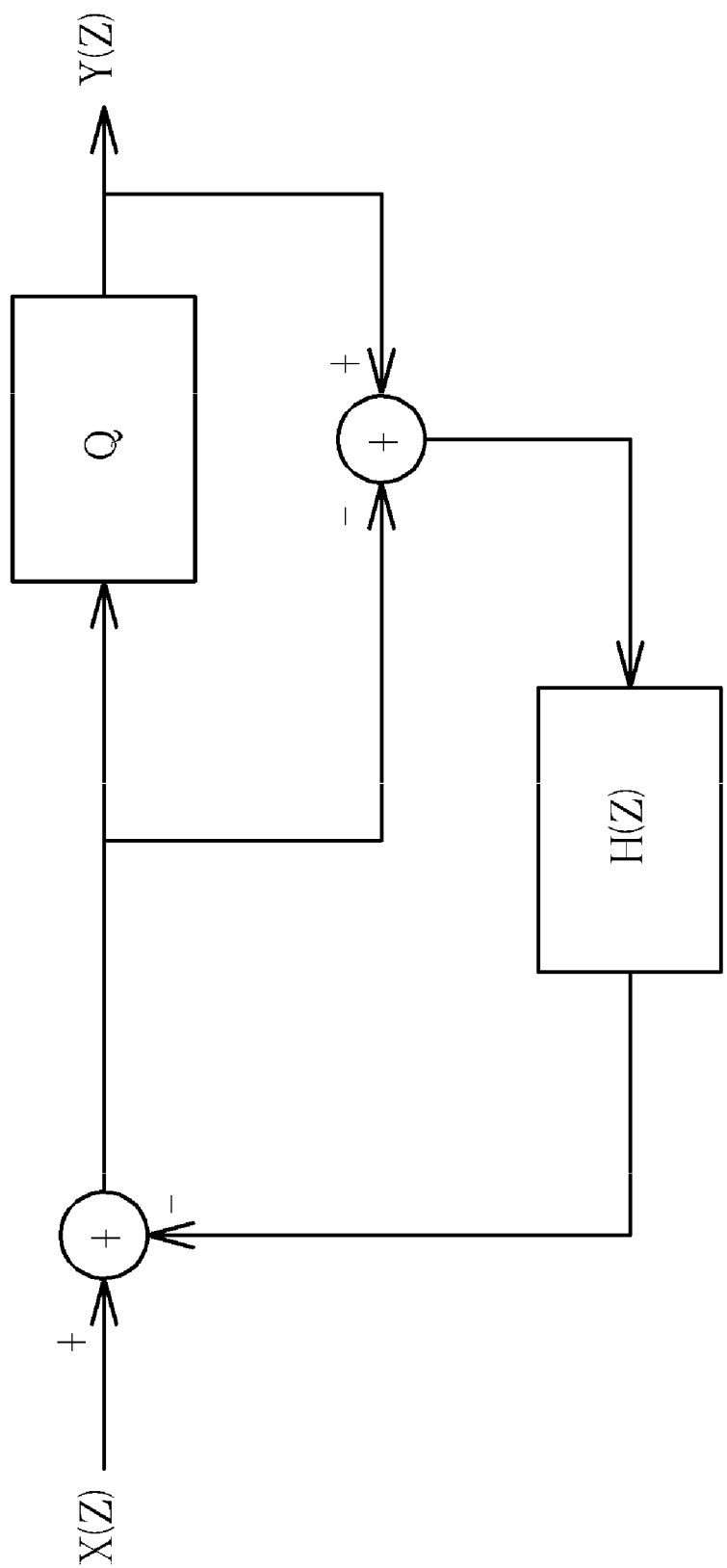
FIG. 2 is a diagram illustrating an exemplary model of the signal processing apparatus in a Z-transform domain.
Figure 3:
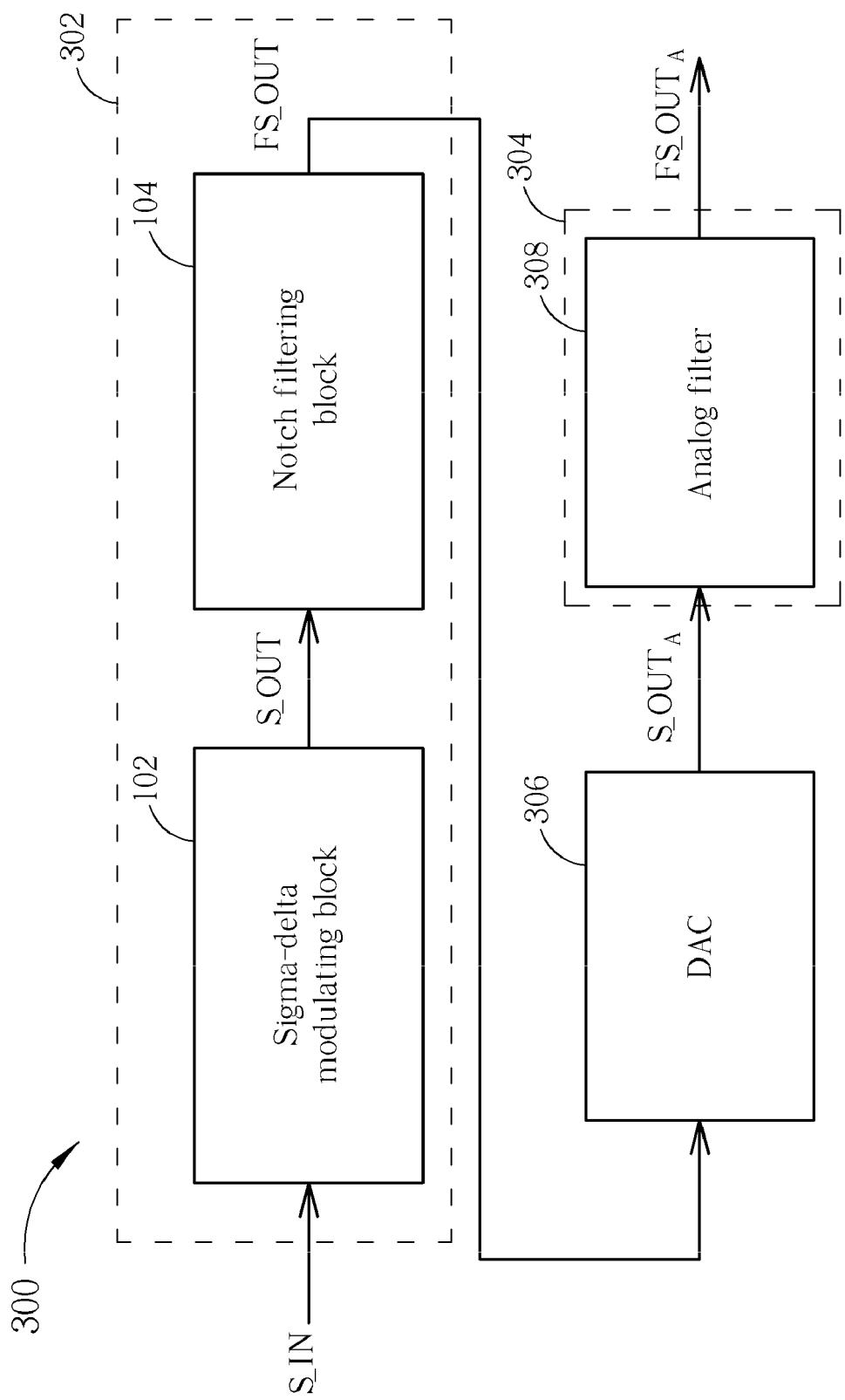
FIG. 3 is a diagram illustrating a signal processing apparatus according to a second exemplary embodiment of the present invention.

As the realization of the sigma-delta modulation with notch filtering may be simplified by using the exemplary circuitry model shown in FIG. 2, the combination of the sigma-delta modulating block 102 and the notch filtering block 104 is suitable for a high-speed application. By way of example, but not limitation, each of the sigma-delta modulating block 102 and the notch filtering block 104 is a digital circuit operating in a digital domain rather than an analog domain. Please refer to FIG. 3, which is a diagram illustrating a signal processing apparatus according to a second exemplary embodiment of the present invention. The exemplary signal processing apparatus 300 includes, but is not limited to, the aforementioned sigma-delta modulating block 102 and notch filtering block 104 shown in FIG. 1, a digital-to-analog converter (DAC) 306 operating according to the aforementioned sampling clock frequency Fs, and an analog filter 308. Please note that the sigma-delta modulating block 102 and the notch filtering block 104 are both operating in a digital domain 302, while the analog filter 308 is operating in an analog domain 304. Therefore, each of the input signal S_IN and the filtered signal output FS_OUT is a digital signal (i.e., a discrete-time signal). As shown in FIG. 3, the DAC 306 is coupled to the notch filtering block 104, and arranged to convert the filtered signal output FS_OUT into an analog signal output $S\_OUT_A$ which is a continuous-time signal. The DAC 306 may be configured to operate according to a high sampling clock frequency Fs such as 500 MHz. Regarding the analog filter 308 operating in the analog domain 304, it is coupled to the DAC 306, and arranged to perform an analog filtering operation upon the analog signal output $S\_OUT_A$ and accordingly generate a filtered analog signal output $FS\_OUT_A$. As the sigma-delta modulation with notch filtering is capable of attenuating unwanted signal components at notch frequencies close to the desired frequencies of the wanted signal components, the requirement of the analog filtering operation performed by the following analog filter 308 may be relaxed. For example, the analog filter 308 may be implemented by a passive filter instead of an active filter. Thus, the chip area and the current consumption of the DAC 306 and the analog filter 308 may be reduced due to the implementation of the preceding signal-delta modulating block 102 and notch filtering block 104. In addition, the analog filter 308 may be implemented by core devices which can operate under a low supply voltage. Thus, the signal processing apparatus 300 shown in FIG. 3 is suitable for a specific application which employs a new generation battery used for providing a low supply voltage.

Figure 4:
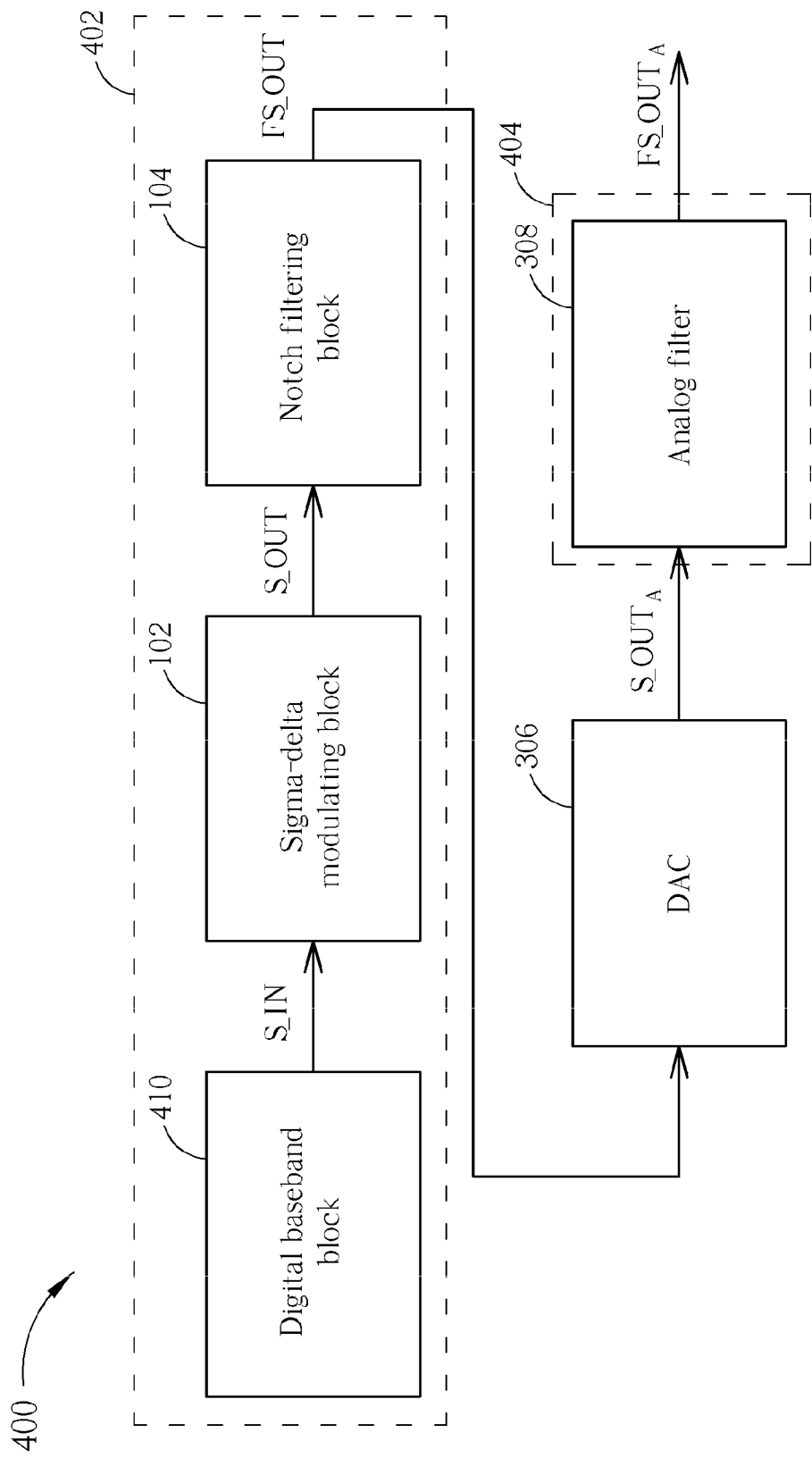
FIG. 4 is a diagram illustrating a signal processing apparatus according to a third exemplary embodiment of the present invention.

Please note that the signal processing apparatus 300 shown in FIG. 3 is suitable for a variety of applications which require analog filters for noise suppression. For example, a wireless communication device, such as a transmitter, may benefit from the use of the signal processing apparatus 300. Please refer to FIG. 4, which is a diagram illustrating a signal processing apparatus according to a third exemplary embodiment of the present invention. The exemplary signal processing apparatus 400 includes, but is not limited to, a digital baseband block 410 and the aforementioned components including the sigma-delta modulating block 102, the notch filtering block 104, the DAC 306, and analog filter 308. The digital baseband block 410 is coupled to the sigma-delta modulating block 102 and arranged to generate a digital baseband output as the signal input S_IN of the sigma-delta modulating block 102.

Figure 5:
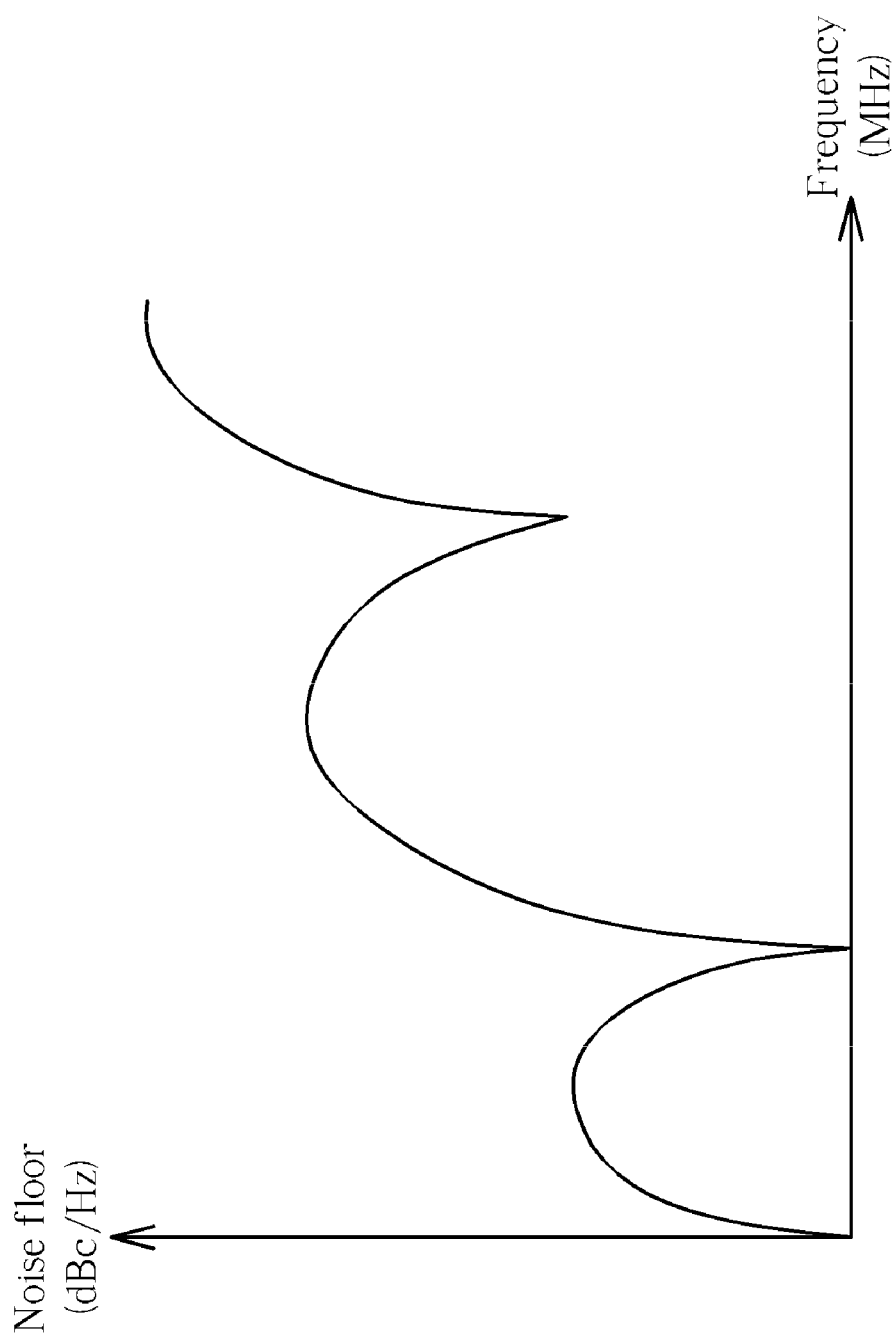
FIG. 5 is a diagram illustrating exemplary filter rejection characteristic of a noise transfer function of a sigma-delta modulation with notch filtering.

As mentioned above, the parameters k, m, and n may be properly set to meet the requirement of a particular application. For example, the signal processing apparatus 400 shown in FIG. 4 may be implemented in a wireless communication transmitter which supports frequency division duplexing (FDD) and time division duplexing (TDD) and enables either of FDD and TDD for signal transmission. When band 2 of a third generation (3G) wireless communication mode for FDD is selected for signal communication, the desired frequency of the wanted signal component falls within a range from 80 MHz to 95 MHz. Therefore, based on the above equation (6), n should be set by 3 if the sampling clock frequency Fs used by DAC 306/sigma-delta modulating block 102 is 500 MHz, and n should be set by 1.5 (i.e., 3/2) if the sampling clock frequency Fs used by DAC 306/sigma-delta modulating block 102 is 250 MHz. When band 1 of the 3G wireless communication mode for FDD is selected for signal communication, the desired frequency of the wanted signal component is 190 MHz. Therefore, based on the above equation (6), n should be set by 4 if the sampling clock frequency Fs used by DAC 306/sigma-delta modulating block 102 is 500 MHz, and n should be set by 2 (i.e., 4/2) if the sampling clock frequency Fs used by DAC 306/sigma-delta modulating block 102 is 250 MHz. When band 5/8 of the 3G wireless communication mode for FDD is selected for signal communication, the desired frequency of the wanted signal component is 45 MHz. Therefore, based on the above equation (6), n should be set by 6 if the sampling clock frequency Fs used by DAC 306/sigma-delta modulating block 102 is 500 MHz, and n should be set by 3 (i.e., 6/2) if the sampling clock frequency Fs used by DAC 306/sigma-delta modulating block 102 is 250 MHz. Regarding the remaining parameters m and k, they should be properly set, too. For example, when the band 1 of the 3G wireless communication mode for FDD is selected for signal communication, the parameter k may be set by 3, and the parameter m may be set by 2. The exemplary filter rejection characteristic of the noise transfer function of the combination of the sigma-delta modulating block 102 and the notch filtering block 104 with a particular parameter setting (e.g., k=3, m=2, and n=4) is shown in FIG. 5.

In accordance with above equation (2), the system function H(Z) would have the following polynomial coefficients: [0, −3, 3, −1, 2, −6, 6, −2, 1, −3, 3, −1]. Therefore, it is easy to implement the sigma-delta modulating block 102 and the notch filtering block 104. More specifically, to simplify the realization of the sigma-delta modulation with notch filtering, all of the parameters m, k, and n and polynomial coefficients will be particularly designed to be integers. However, this is for illustrative purposes only, and is not meant to be a limitation of the present invention. That is, any circuit implementation employing the circuit model in FIG. 2 with the STF as defined in equation (1) and NTF as defined in equation (2) obeys the spirit of the present invention and falls within the scope of the present invention.

In this exemplary embodiment, the digital baseband block 410, the sigma-delta modulating block 102, and the notch filtering block 104 are operating in a digital domain 402, while the analog filter 308 is operating in an analog domain 404. As the combination of the sigma-delta modulating block 102 and the notch filtering block 104 is capable of attenuating an unwanted signal component at a frequency close to a desired frequency of the wanted signal component, the analog filter 308 may be simply implemented by a passive filter. In this way, the chip size and the current consumption of the DAC 306 and the analog filter 308 may be reduced greatly. Since there is no need to use strong filtering in the analog domain 404, the anti-drooping compensation may be avoided, and good group delay control may be obtained.

Briefly summarized, in a case where the sigma-delta modulating block 102 and the notch filtering block 104 are implemented by digital circuits, the sigma-delta modulation characteristic and/or the notch filter characteristic may be digitally programmable. By way of example, but not limitation, the notch filtering block 104 may have at least a stopband centered at a programmable center frequency, wherein the programmable center frequency is set in response to a selection of a target signal band; the notch filtering block 104 may have a programmable number of stopbands; and/or the sigma-delta modulating block 102 may have a programmable order of the sigma-delta modulation.

Figure 6:
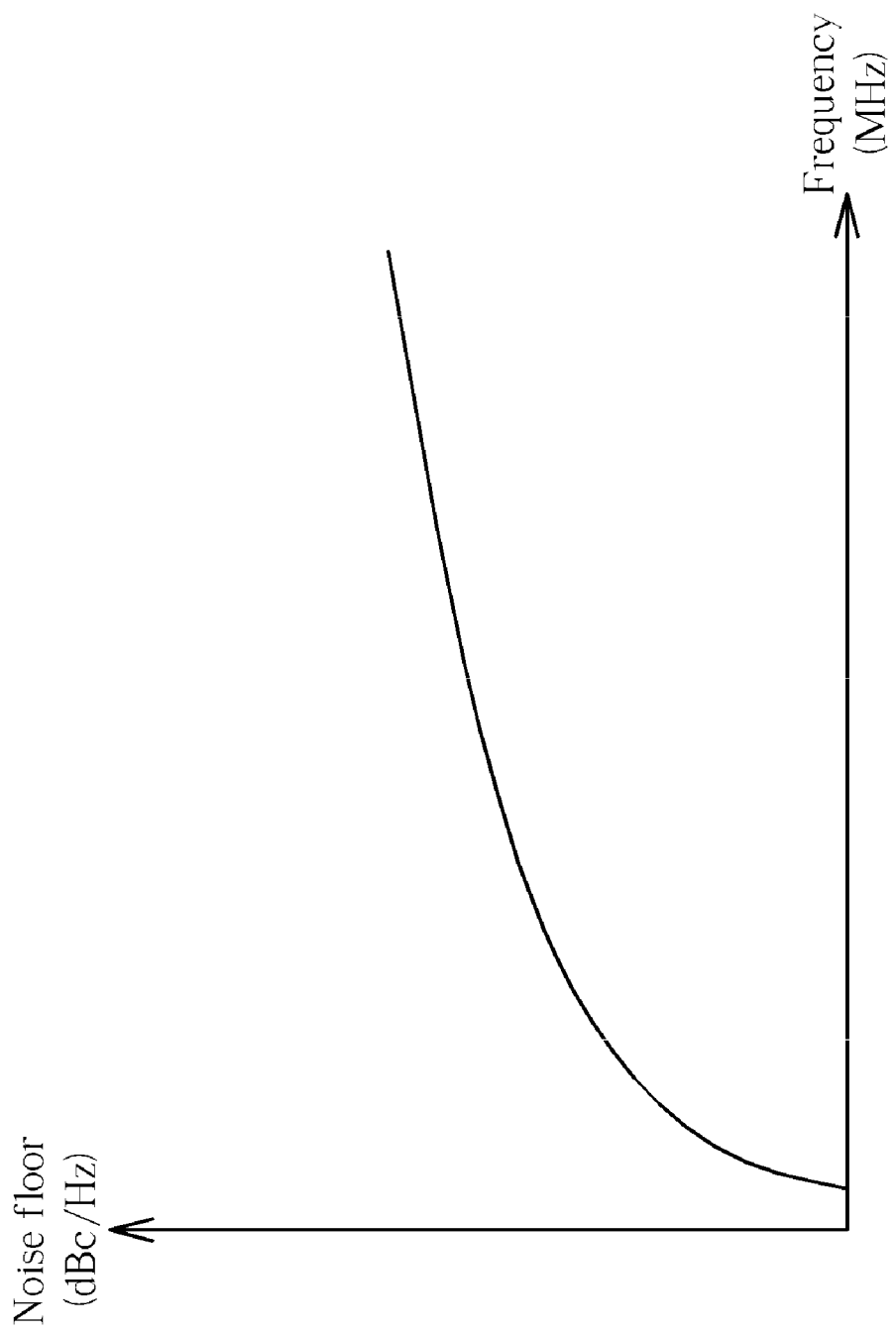
FIG. 6 is a diagram illustrating exemplary filter rejection characteristic of a noise transfer function of a sigma-delta modulation without notch filtering.

In addition to the 3G wireless communication mode (e.g., an FDD mode for WiMAX/LTE technology), the signal processing apparatus 400 may support a second generation (2G) wireless communication mode. As a transmitter operating in the 2G wireless communication mode does not need the notch filtering for providing signal attenuation at a particular frequency, the notch filtering block 104 may be disabled by setting the parameter m to zero. To put it another way, the sigma-delta modulating block 102 is arranged to perform a sigma-delta modulation upon the signal input S_IN (e.g., a digital baseband signal) and accordingly generate the signal output S_OUT, and the notch filtering block 104 is enabled for performing a notch filtering operation upon the signal output S_OUT when the signal processing apparatus operates in a first operational mode (e.g., the 3G wireless communication mode), and the notch filtering block is disabled when the signal processing apparatus operates in a second operational mode (e.g., the 2G wireless communication mode). Thus, as the notch filtering block 104 is programmable, a notch filtering operation is enabled for processing the signal output S_OUT when a first operational mode is active, and the notch filtering operation is stopped from processing the signal output S_OUT when a second operational mode is active. The exemplary filter rejection characteristic of the noise transfer function of the sigma-delta modulating block 102 with the notch filtering block 104 disabled is shown in FIG. 6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing apparatus, implemented in a wireless communication application, comprising:
   a sigma-delta modulating block, arranged to perform a sigma-delta modulation upon a signal input and accordingly generate a signal output; and
   a notch filtering block, arranged to perform a notch filtering operation upon the signal output and accordingly generate a filtered signal output, wherein the notch filtering block has a programmable number of stopbands.

2. The signal processing apparatus of claim 1, wherein each of the sigma-delta modulating block and the notch filtering block is a digital circuit.

3. The signal processing apparatus of claim 1, further comprising:
   a digital-to-analog converter (DAC), arranged to convert the filtered signal output into an analog signal output;
   an analog filter, arranged to perform an analog filtering operation upon the analog signal output and accordingly generate a filtered analog signal output; and
   a digital baseband block, arranged to generate a digital baseband output as the signal input of the sigma-delta modulating block.

4. The signal processing apparatus of claim 1, wherein the notch filtering block has at least a stopband centered at a programmable center frequency set in response to a selection of a target signal band.

5. The signal processing apparatus of claim 1, wherein the sigma-delta modulating block has a programmable order of the sigma-delta modulation.

6. The signal processing apparatus of claim 1, wherein the sigma-delta modulating block in combination with the notch filtering block have a signal transfer function (STF) and a noise transfer function (NTF) as follows:

$$STF=1;$$

and $$NTF=1+H(Z)=(1-Z^{-1})^k(1+Z^{-n})^m.$$

where k represents an order of the sigma-delta modulation, m represents a number of stopbands provided by the notch filtering block, n is a value which controls spacing between notch frequencies, and a center frequency f of an $i^{th}$ stopband and a sampling clock frequency Fs satisfy the following equation:

$$f = \frac{2i+1}{2n}Fs.$$

7. The signal processing apparatus of claim 1, being implemented in an application which supports a third generation (3G) wireless communication mode and a second generation (2G) wireless communication mode;
wherein the notch filtering block is enabled when the application operates in the 3G wireless communication mode, and the notch filtering block is disabled when the application operates in the 2G wireless communication mode.

8. The signal processing apparatus of claim 1, wherein the wireless communication application is a frequency division duplexing (FDD) application.

9. A signal processing method, employed by a wireless communication application, comprising:
performing a sigma-delta modulation upon a signal input and accordingly generating a signal output; and
performing a notch filtering operation upon the signal output and accordingly generating a filtered signal output, wherein the notch filtering operation has a programmable number of stopbands.

10. The signal processing method of claim 9, wherein each of the sigma-delta modulation and the notch filtering operation is performed in a digital domain.

11. The signal processing method of claim 9, further comprising:
performing a digital-to-analog conversion upon the filtered signal output and accordingly generating an analog signal output;
performing an analog filtering operation upon the analog signal output and accordingly generating a filtered analog signal output; and
generating a digital baseband output as the signal input.

12. The signal processing method of claim 9, wherein the sigma-delta modulation in combination with the notch filtering operation have a signal transfer function (STF) and a noise transfer function (NTF) as follows:

STF=1;

and $NTF=1+H(Z)=(1-Z^{-1})^k(1+Z^{-n})^m,$ where k represents an order of the sigma-delta modulation, m represents a number of stopbands provided by the notch filtering operation, n is a value which controls spacing between notch frequencies, and a center frequency f of an $i^{th}$ stopband and a sampling clock frequency Fs satisfy the following equation:

$$f = \frac{2i+1}{2n}Fs.$$

13. The signal processing method of claim 9, being employed by an application which supports a third generation (3G) wireless communication mode and a second generation (2G) wireless communication mode;
wherein the signal processing method further comprises:
enabling the notch filtering operation when the application operates in the 3G wireless communication mode; and
disabling the notch filtering operation when the application operates in the 2G wireless communication mode.

14. The signal processing method of claim 9, wherein the wireless communication application is a frequency division duplexing (FDD) application.

15. A signal processing apparatus, comprising:
a sigma-delta modulating block, arranged to perform a sigma-delta modulation upon a signal input and accordingly generate a signal output; and
a notch filtering block, wherein the notch filtering block is enabled for performing a notch filtering operation upon the signal output when the signal processing apparatus operates in a first operational mode, and the notch filtering block is disabled when the signal processing apparatus operates in a second operational mode.

16. The signal processing apparatus of claim 15, wherein each of the sigma-delta modulating block and the notch filtering block is a digital circuit.

17. The signal processing apparatus of claim 15, further comprising:
a digital-to-analog converter (DAC), arranged to convert the filtered signal output into an analog signal output;
an analog filter, arranged to perform an analog filtering operation upon the analog signal output and accordingly generate a filtered analog signal output; and
a digital baseband block, arranged to generate a digital baseband output as the signal input of the sigma-delta modulating block.

18. The signal processing apparatus of claim 15, wherein the notch filtering block has at least a stopband centered at a programmable center frequency set in response to a selection of a target signal band.

19. The signal processing apparatus of claim 15, wherein the notch filtering block has a programmable number of stopbands.

20. The signal processing apparatus of claim 15, wherein the sigma-delta modulating block has a programmable order of the sigma-delta modulation.

21. The signal processing apparatus of claim 15, wherein the sigma-delta modulating block in combination with the notch filtering block have a signal transfer function (STF) and a noise transfer function (NTF) as follows:

STF=1;

and $NTF=1+H(Z)=(1-Z^{-1})^k(1+Z^{-n})^m,$ where k represents an order of the sigma-delta modulation, m represents a number of stopbands provided by the notch filtering block, n is a value which controls spacing between notch frequencies, and a center frequency f of an $i^{th}$ stopband and a sampling clock frequency Fs satisfy the following equation:

$$f = \frac{2i+1}{2n}Fs.$$

22. The signal processing apparatus of claim 15, being implemented in a frequency division duplexing (FDD) application.

23. A signal processing method, comprising:
    performing a sigma-delta modulation upon a signal input and accordingly generate a signal output;
    when a first operational mode is active, enabling a notch filtering operation for processing the signal output; and
    when a second operational mode is active, stopping the notch filtering operation from processing the signal output.

24. The signal processing method of claim 23, wherein each of the sigma-delta modulation and the notch filtering operation is performed in a digital domain.

25. The signal processing method of claim 23, further comprising:
    performing a digital-to-analog conversion upon the filtered signal output and accordingly generating an analog signal output;
    performing an analog filtering operation upon the analog signal output and accordingly generating a filtered analog signal output; and
    generating a digital baseband output as the signal input.

26. The signal processing method of claim 23, wherein the sigma-delta modulation in combination with the notch filtering operation have a signal transfer function (STF) and a noise transfer function (NTF) as follows:

$$STF=1;$$

and $$NTF=1+H(Z)=(1-Z^{-1})^k(1+Z^{-n})^m$$

, where k represents an order of the sigma-delta modulation, m represents a number of stopbands provided by the notch filtering operation, n is a value which controls spacing between notch frequencies, and a center frequency f of an $i^{th}$ stopband and a sampling clock frequency Fs satisfy the following equation:

$$f = \frac{2i+1}{2n} Fs.$$

27. The signal processing method of claim 23, being employed by a frequency division duplexing (FDD) application.

* * * * *